US006903269B2

(12) United States Patent
Oda

(10) Patent No.: US 6,903,269 B2
(45) Date of Patent: Jun. 7, 2005

(54) COVER SUPPORT STRUCTURE OF SHIELD CASE

(75) Inventor: Takato Oda, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 0 days.

(21) Appl. No.: 10/781,683

(22) Filed: Feb. 20, 2004

(65) Prior Publication Data
US 2004/0163834 A1 Aug. 26, 2004

(30) Foreign Application Priority Data

Feb. 21, 2003 (JP) ........................................ 2003-044390

(51) Int. Cl.$^7$ .............................................. H05K 5/02
(52) U.S. Cl. ..................................... 174/52.1; 361/724
(58) Field of Search ......................... 174/50, 52.1, 53, 174/66, 67; 361/600, 724, 752, 755

(56) References Cited

U.S. PATENT DOCUMENTS

| | | | | |
|---|---|---|---|---|
| 5,162,978 A | * | 11/1992 | Vogt et al. | 361/752 |
| 5,272,297 A | * | 12/1993 | Reichow et al. | 361/600 |
| 5,933,328 A | * | 8/1999 | Wallace et al. | 361/752 |
| 6,121,549 A | * | 9/2000 | Korhonen | 174/50 |
| 6,144,549 A | * | 11/2000 | Moss et al. | 361/724 |
| 6,169,653 B1 | * | 1/2001 | Engel | 361/600 |
| 6,246,578 B1 | * | 6/2001 | Wei et al. | 361/724 |
| 6,259,025 B1 | * | 7/2001 | Tai | 174/66 |
| 6,498,727 B2 | * | 12/2002 | Carr | 361/725 |
| 6,654,236 B2 | * | 11/2003 | Chen et al. | 361/724 |
| 6,700,776 B2 | * | 3/2004 | Bang et al. | 361/724 |
| 6,730,845 B1 | * | 5/2004 | Criniti et al. | 174/53 |

FOREIGN PATENT DOCUMENTS

JP   2000-56052   2/2000

* cited by examiner

Primary Examiner—Dean A. Reichard
Assistant Examiner—Adolfo Nino
(74) Attorney, Agent, or Firm—Wenderoth, Lind & Ponack, L.L.P.

(57) ABSTRACT

An easy-to-operate support structure of a cover in which the cover can stably remain upright and specifically elongated wires are not required for connecting a substrate fitted to the cover and a substrate of a case main body is provided for a cover support structure of a shield case including a case main body having a bottom plate, side plates and a back plate and a cover having an upper plate and side plates covering the case main body. To prevent the cover from turning down when the cover is opened, engagement grooves capable of meshing with the back plate and/or the side plates of the case main body are formed in the upper plate and/or the side plates of the cover, and the cover can turn upright when the engagement grooves are meshed with the back plate or the side plates of the case main body.

4 Claims, 9 Drawing Sheets

COVER SUPPORT STRUCTURE OF SHIELD CASE

BACKGROUND OF THE INVENTION

1. Field of the Invention

The present invention relates to a structure for turning upright and supporting stably an openable cover of a shield case of electrical and electronic appliances in an open state.

2. Related Art

Electric and electronic appliances have various kinds of electric and electronic circuits assembled therein and these circuits are shielded lest noise enters from an external electric or magnetic field. Shielding methods include a method that covers the appliance as a whole with a shield case and a method that covers individual components. The invention is directed to the former, that is, the method capable of covering the appliance as a whole.

The shield case is a kind of sealed container formed of a metal sheet capable of shielding the electric or magnetic field. The shield case accommodates therein electronic and electric appliances. To produce, repair and conduct maintenance of the appliance, a cover fitted openably to a case main body is opened. Conventionally, the cover has been detachably set to the case main body with screws and after the screws are removed, the cover is separated from the case main body and is put nearby.

JP-A-2000-56052 describes a "Shield Case" having a structure in which a cover is detachable from a case main body and is fitted in such a fashion as to be capable of being opened and closed relative to a shaft as a center and maintenance and repair can be conducted while the cover is open without being separated from the case main body. In other words, according to this shield case, "the cover is allowed by anchor means to shift between a closed state and an open state relative to the case main body and to be detachable. When the cover is under the closed state, engagement means anchors the cover to the case main body".

The cover can be opened and closed with its center positioned at an engagement portion between a projection formed at a rear part of the case main body and a small rectangular opening formed in the cover, and can be fitted and removed, too. Therefore, work operations such as assembly of electronic components and maintenance and repair can be easily conducted inside the shield case while the cover is open without being removed from the case main body. Because the cover is fitted openably through the anchor means, a jig for provisionally placing the cover is not necessary.

However, the projection provided to the case main body must be fitted to the small rectangular open portion formed in the cover and the fitting/removing operation of the cover is troublesome. In addition, the projection provided to the case main body is likely to fall off due to deformation of the side plate, so that the cover often falls off and the opening/closing operation of the cover cannot be made smoothly. In some cases, a metallic sound occurs with the opening/closing operation. The cover is supported in such a fashion that when the cover is opened, the edge of its ceiling plate does not strike the edge or the support side plates of the wall plates and the case main body does not turn down. However, because the cover is opened beyond 90 degrees and is inclined, the case main body is not stabilized and sometimes turns down rearward with the cover.

On the other hand, a substrate having an electronic circuit or circuits constituted thereon is fitted to the cover in some cases and is connected to a substrate fitted to the case main body through a large number of wires. When the cover is opened under such a state, the wires must be long. In a structure wherein the cover is removed from the case main body and is then opened, the length of the wires connecting both substrates becomes much longer. Needless to say, the connecting wires can be separated from the substrates when the cover is opened, but a socket for connection must be removed, and this operation is troublesome.

SUMMARY OF THE INVENTION

The cover of the shield case according to the prior art is not free from the problems described above. To solve these problems, the present invention provides a support structure of a cover in which a cover opening/closing operation is easy, the opened cover stays upright stably and wires having a specifically elongated length are not required for connecting a substrate fitted to the cover to a substrate provided to a case main body.

The present invention provides a cover support structure of a shield case including a case main body having a bottom plate, side plates and a back plate and a cover having an upper plate and side plates for covering the case main body, supporting the cover in such a fashion as to prevent the cover from turning down when the cover is opened. Engagement grooves capable of meshing with the back plate and/or the side plates of the case main body are formed in the upper plate and/or the side plates of the cover so that the cover can be kept upright while the engagement grooves are meshed with the back plate or the side plates of the case main body.

The engagement groove described above may be a slit groove formed by cutting at least one of the side plates of the cover from its rear end and forming a slit and capable of meshing with the back plate of the case main body. This slit groove may be formed in both or either one of the side plates.

The engagement groove may be a slit groove formed by cutting a part of the upper plate of the cover inwardly, providing the support plate at at least one or more positions, and cutting the support plate from its rear end and forming a slit to be capable of meshing with the back plate of the case main body.

The engagement groove described above may be a slit groove formed by cutting up one of the side plates of the cover from its rear end and forming a slit, and a slit groove formed by forming a slit in a support plate formed by cutting up the upper plate on the side of the other of the side plates, and both of these slit grooves can mesh with the back plate of the case main body.

Further, a slit groove may be formed by cutting from above the back plate of the case main body opposing the engagement groove and may mesh with the engagement groove. The upright state of the cover can be made more reliable in this way.

The engagement groove described above may be a groove formed in at least one of the side plates of the cover in such a fashion as to protrude outward and to open upward. A circular cylindrical projection fitting into the groove is formed in this case in one of the opposing side plates of the case main body so that the cover can turn and can be fitted and removed with the projection being an axis. The cover can be supported upright while a rear edge of the upper plate of the cover maintains contact with the back plate of the case main body.

A non-circular projection may be formed in at least one of the side plates of the case main body, and the engagement groove may be a groove formed by cutting a slit on at least one of the side plates of the cover from its rear end in such a shape that the noncircular projection can fit when the cover is in the horizontal and vertical states. By making the shape of the projection noncircular and forming the groove into the shape to which the noncircular projection can fit in the horizontal and vertical states, the cover cannot rotate in the state in which the noncircular projection fits into the slit groove. According to this structure, the noncircular projection can fit into the slit groove only in the covering state of the cover and in its upright state. The shape of the noncircular projection may be one other than a circle, such as an ellipse, an elongated circle, or the like.

According to the cover support structure described above, when the cover of the shield case is opened and is once removed from the case main body, and the engagement groove is meshed with the back plate of the case main body or its side plate, the cover can be kept upright in a stable state. Therefore, this structure is convenient when assembly of components to the case main body, adjustment of the components and maintenance and repair are carried out. The wires connecting the substrate fitted to the case main body to the substrate fitted to the cover need not be cut off even when the cover is opened and turned upright. In addition, elongated wires are not required. Preferred embodiments of the invention will be hereinafter explained in detail with reference to the accompanying drawings.

DETAILED DESCRIPTION OF PREFERRED EMBODIMENT

Figure 1:
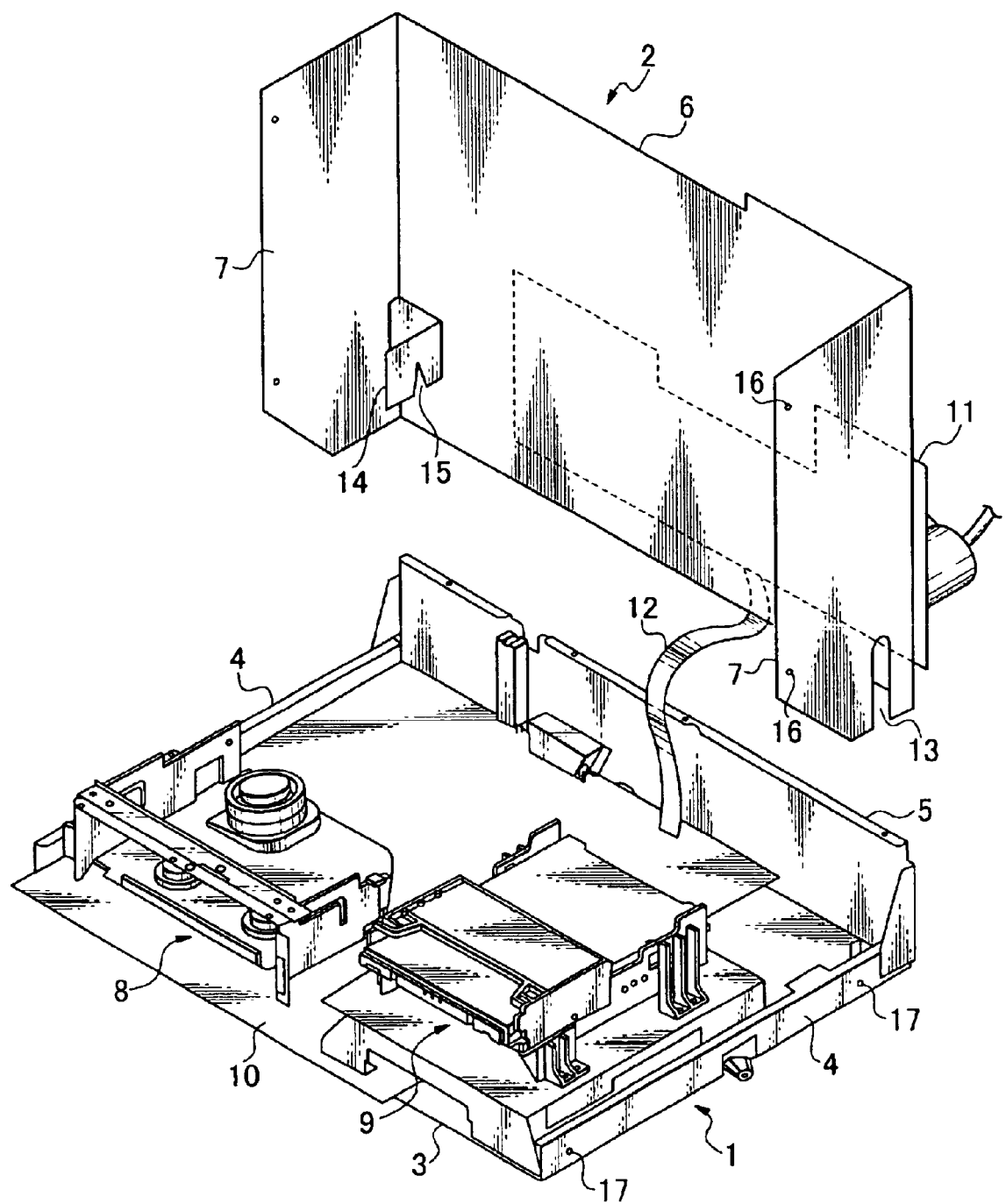
FIG. 1 is a perspective view showing a cover support structure of a shield case according to a first embodiment of the invention.

FIG. 1 shows a cover support structure of a shield case according to a first embodiment of the invention that includes a case main body 1 and a cover 2. The case main body 1 has a bottom plate 3, two side plates 4 and a back plate 5. The side plates 4 and the back plate 5 stand upright relative to the bottom plate 3. The cover 2 has a bracket shape including an upper plate 6 and two side plates 7. To the case main body 1 shown in the drawing, a video deck 8 and a disk deck 9 are fitted and a substrate 10 having electric circuits for operating these decks is provided.

Another substrate 11 is fitted to the upper plate 6 of the cover 2. Both substrates 10 and 11 are connected to each other through wires 12. The cover 2 shown in the drawing is under the state where it is removed from the case main body 1. A slit groove 13 is formed at the rear end (lower end in the drawing) in one of the side plates 7 of the cover 2. A support plate 14 is formed by cutting up the upper plate 6 at the corner between the other side plate 7 and the upper plate 6. Another slit groove 15 is defined at the rear end of the support plate 14.

Figure 2:
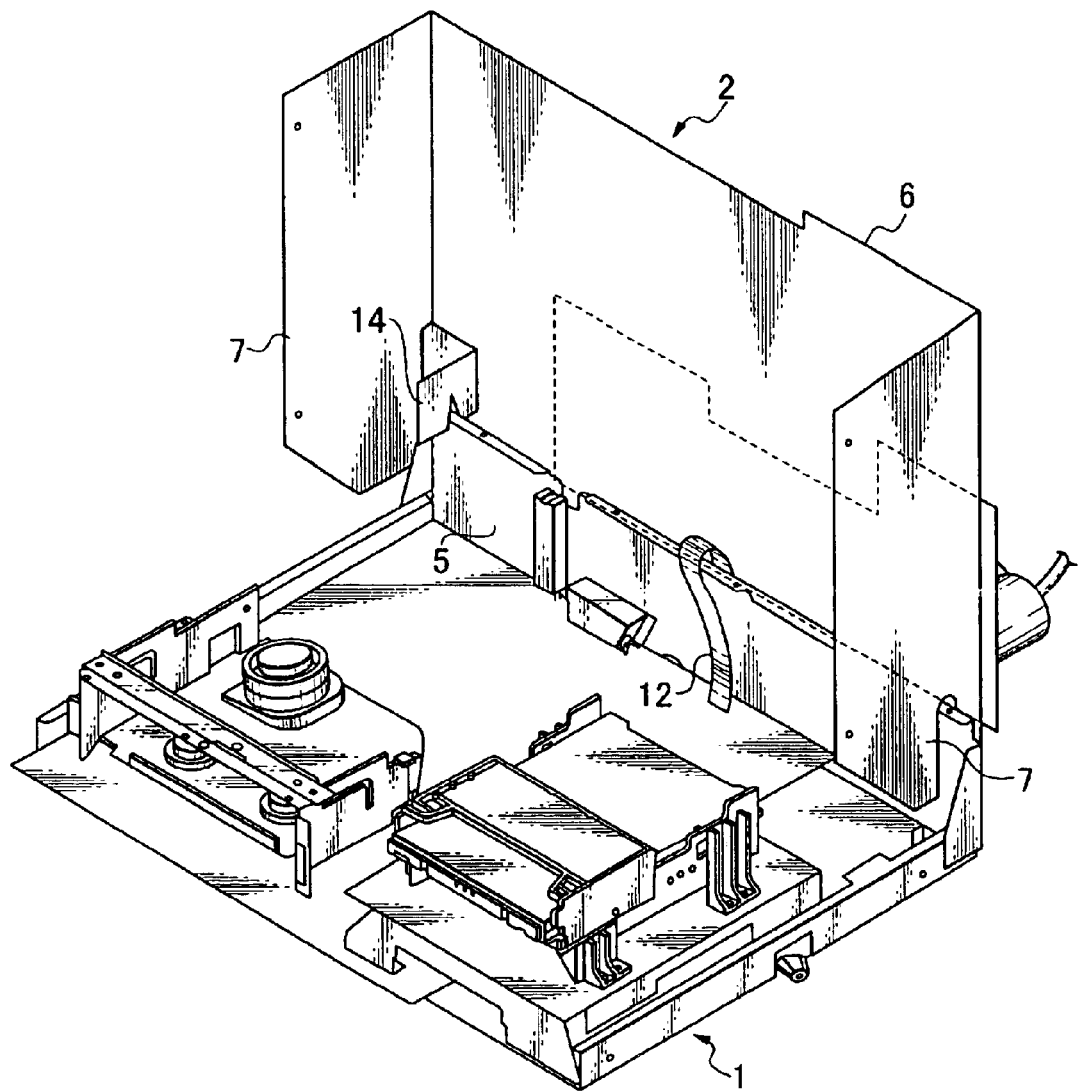
FIG. 2 is a perspective view showing a state where a cover shown in FIG. 1 is upright.

In the cover support structure described above, the cover 2 is fitted to the back plate 5 of the case main body 1 and is turned upright as shown in FIG. 2. The back plate 5 fits into the slit groove 13 formed in the side plate 7 and meshes with the slit groove 15 formed in the support plate 14. When the depth of the slit groove 13 is great, the back plate 5 fits stably and the cover 2 can be kept substantially upright without turning down. The wires 12 connecting the substrate 10 on the case main body side and the substrate 11 on the cover side are passed through a clearance defined between the upper plate 6 and the back plate 5. In other words, the slit grooves 13 and 15 are formed at suitable positions of the side plate 7 and the support plate 14 in such a fashion that the clearance is left between the upper plate 6 and the back plate 5 and the wires 12 need not be removed when the cover 2 is turned upright.

When the cover 2 is kept upright relative to the case main body 1 as described above, assembly and adjustment of components can be carried out under a safe condition, and maintenance and repair can be made smoothly. After the work is completed, the cover 2 is lifted up, is put on the case main body 1 and is set by screws. The screws are fitted from holes 16 defined in the side plates 7 of the cover 2 and are meshed with screw holes 17 formed in the side plates 4 of the case main body 1.

Figure 3:
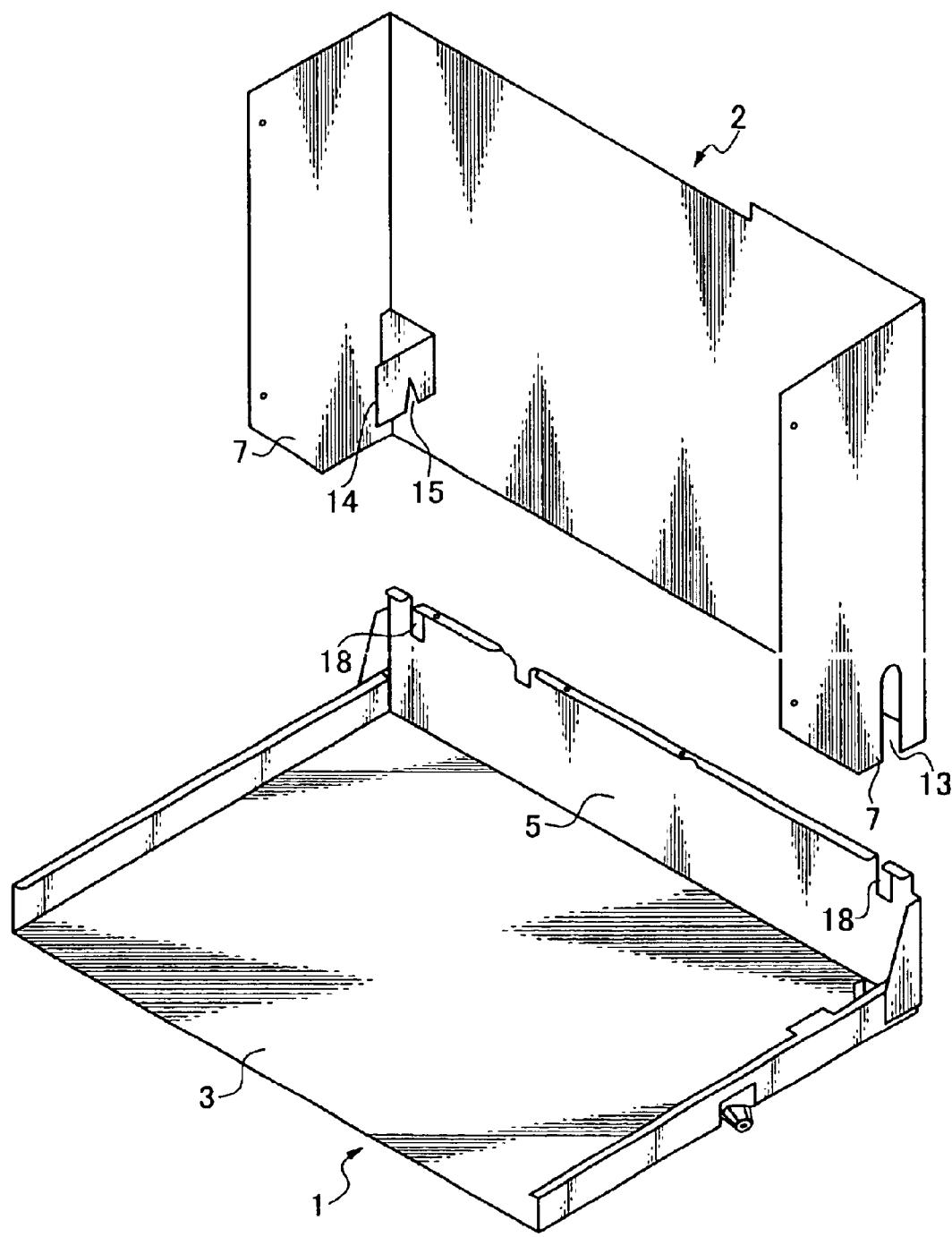
FIG. 3 is a perspective view showing a cover support structure of a shield case according to a second embodiment of the invention.

FIG. 3 shows a cover support structure according to the second embodiment of the invention. This embodiment is the same as the first embodiment in the construction in which the slit groove 13 is formed at the rear end of one of the side plates 7 of the cover 2 and the slit groove 15 is formed in the support plate 14 formed by cutting up the upper plate 6 at the corner between the other side pate 7 and the upper plate 6. Slit grooves 18 are formed in the back plate 5 of the case main body 1 opposing the slit grooves 13 and 15 and extend toward the bottom plate 3. When the cover 2 is removed from the case main body 1 and is turned upright, the slit grooves 13 and 15 on the cover side are meshed with the slit grooves 18 formed in the back plate 5.

Because the slit grooves are not formed in the back plate 5 in the first embodiment, the cover 2 is supported upright but involves the possibility that it moves along the back plate 5 due to vibration or when it is put on an inclined surface. However, because the slit grooves mesh with one another in the second embodiment, the cover 2 does not move along the back plate 5 and its upright state can be maintained more stably due to deeper engagement.

Figure 4:
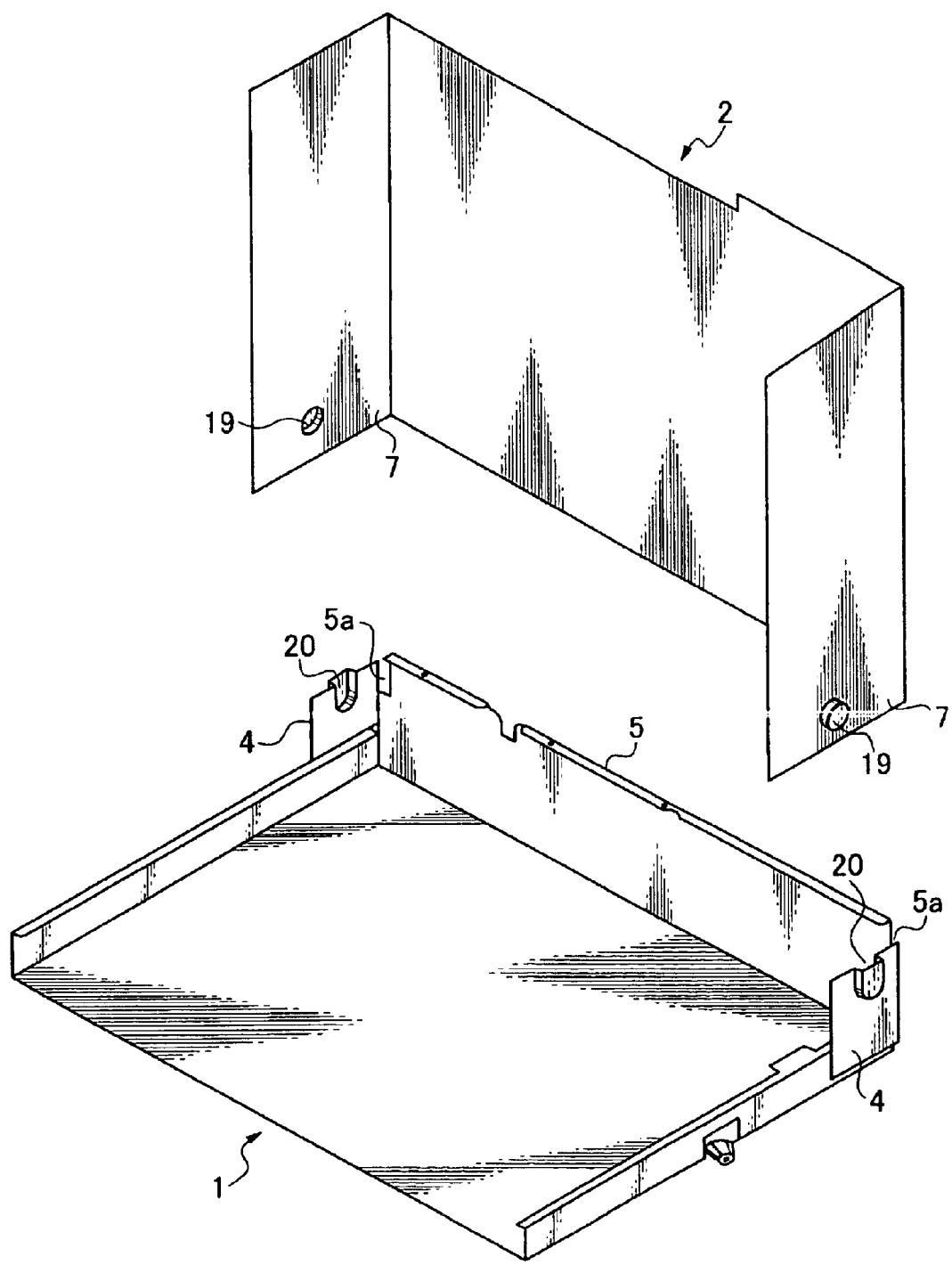
FIG. 4 is a perspective view showing a cover support structure of a shield case according to a third embodiment of the invention.

FIG. 4 shows a cover support structure according to the third embodiment of the invention. Circular cylindrical projections 19 are formed on both side plates 7 of the cover 2 in such a fashion as to protrude outward. Grooves 20 are formed inside the side plates 4 of the case main body 1. The projections 19 of the cover 2 are formed by drawing processing of the side plates 7 and the grooves 20 of the case main body 1 are likewise formed by drawing processing of the side plates 4. The grooves 20 are open upward so that the projections 19 can be fitted from above. In other words, the grooves 20 are open upward not only because the projections 19 can be fitted from above but also because the cover 2 can be fitted and removed easily. The side plates 7 of the cover 2 are formed in such a fashion as to exist inside the side plates 4 of the case main body 1. Slit grooves 5a are formed at the upper part of both ends of the back plate 5 so that the side plates 7 of the cover 2 can be fitted therein.

Figure 5:
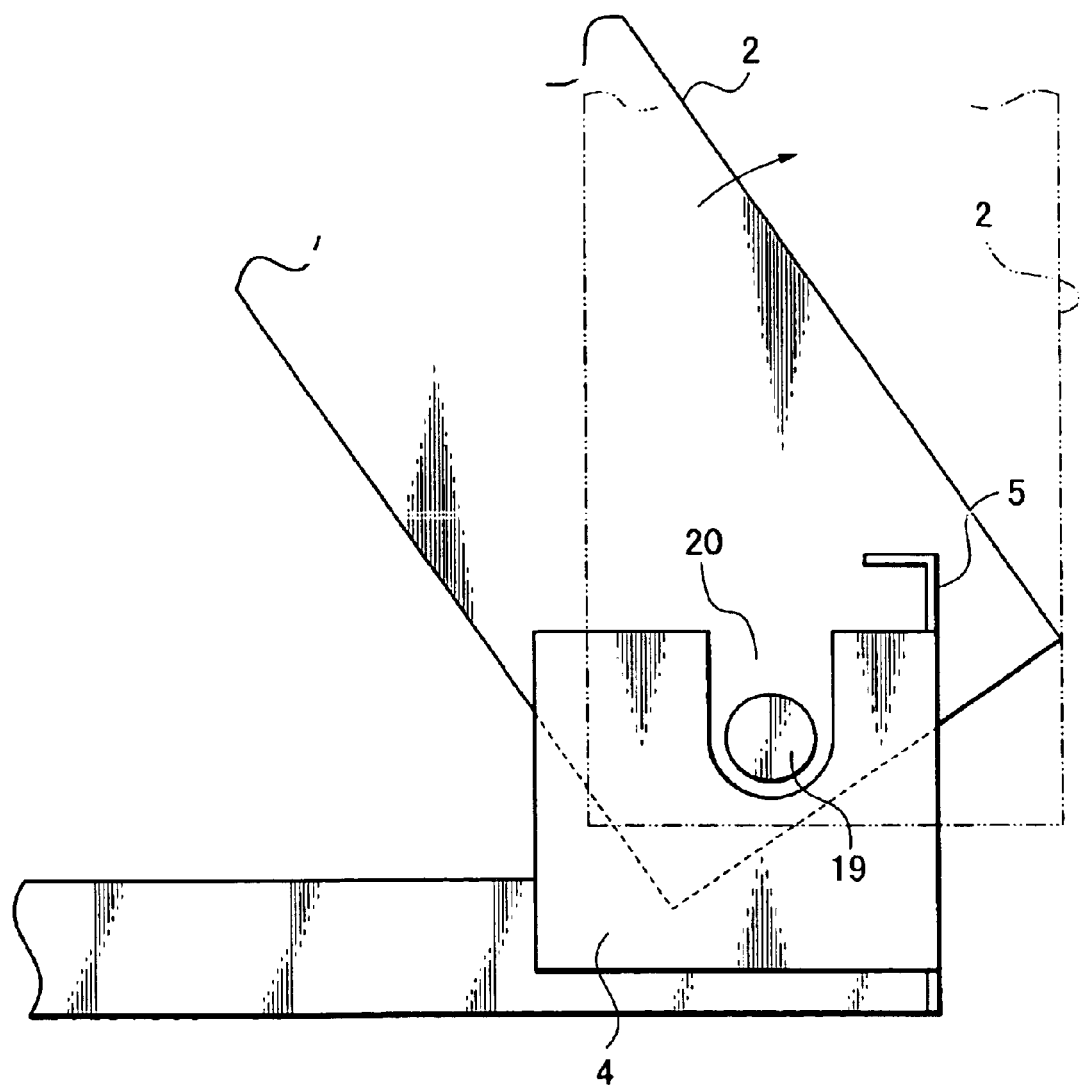
FIG. 5 is a main portion side view showing a state where the cover shown in FIG. 4 is upright.

In this embodiment, the cover 2 covering the case main body 1 can be turned round and upright while the projections 19 remain fitted into the grooves 20 as shown in FIG. 5. Needless to say, it is also possible to remove the cover 2 and then to turn and support it after the projections 19 are fitted into the grooves 20. The projections 19 can be easily fitted and released to and from the grooves 20 opening upward. When the cover 2 is turned upright, the upper sheet edge of the cover 2 strikes the back plate 5 and the cover 2 can be brought substantially upright while being prevented from turning down. The clearance is secured of course between the upper plate 6 and the back plate 5 and the wires 12 connecting both substrates 10 and 11 can pass through this clearance.

Figure 6:
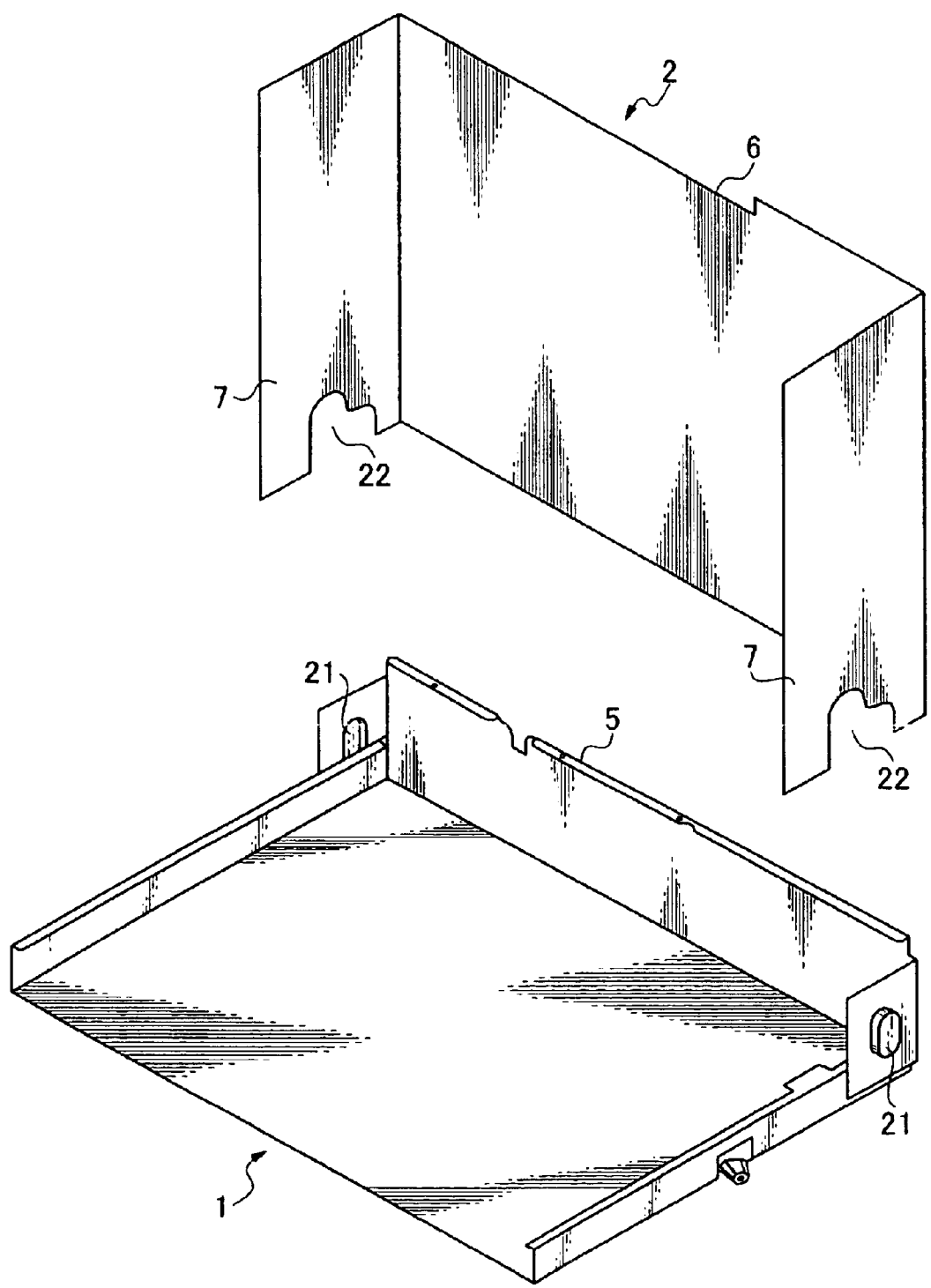
FIG. 6 is a perspective view showing a cover support structure of a shield case according to a fourth embodiment of the invention.

FIG. 6 shows a cover support structure according to the fourth embodiment of the invention. Elongated circular projections 21 are formed by drawing processing of the side plates 4 of the case main body 1 and grooves 22 to which the projections 21 can be fitted are formed by cutting the side plates 7 of the cover 3 from their rear end side. Because the projections 21 as support shafts have the shape of the elongated circle, the cover 2 cannot freely turn but is kept upright when the grooves 22 mesh with the projections 21. In other words, because the projections 21 having the elongated circular shape can fit under the horizontal and vertical conditions of the grooves 22, the cover 2 does not turn down even when it is not supported as the edge of the upper plate 6 strikes the back plate 5. In this embodiment, the cover 2 is formed to a greater width than the case main body 1 so that the side plates 7 of the cover 2 exist outside the side plates 4 of the case main body 1.

Figure 7A:
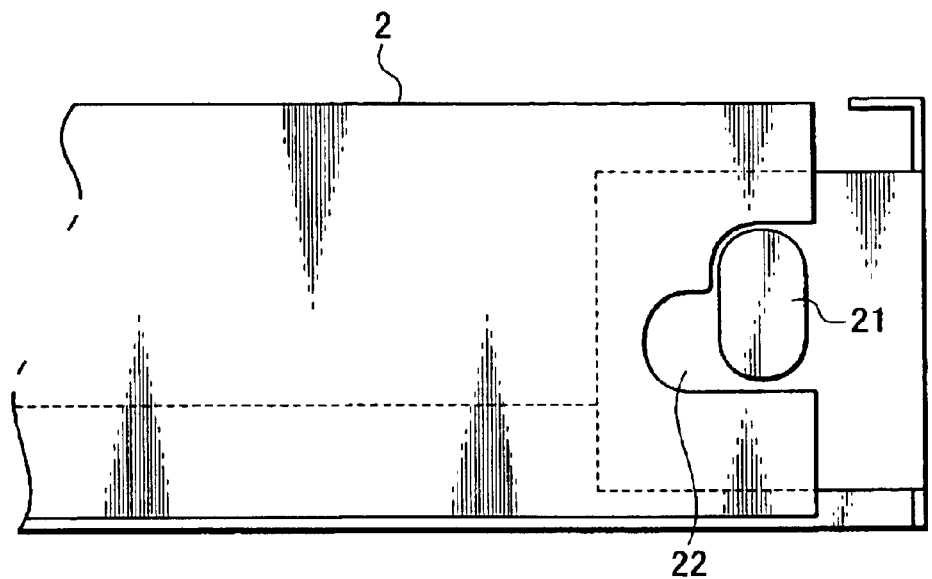
FIG. 7(a) is a main portion side view showing a closed state of the cover shown in FIG. 6.
Figure 7B:
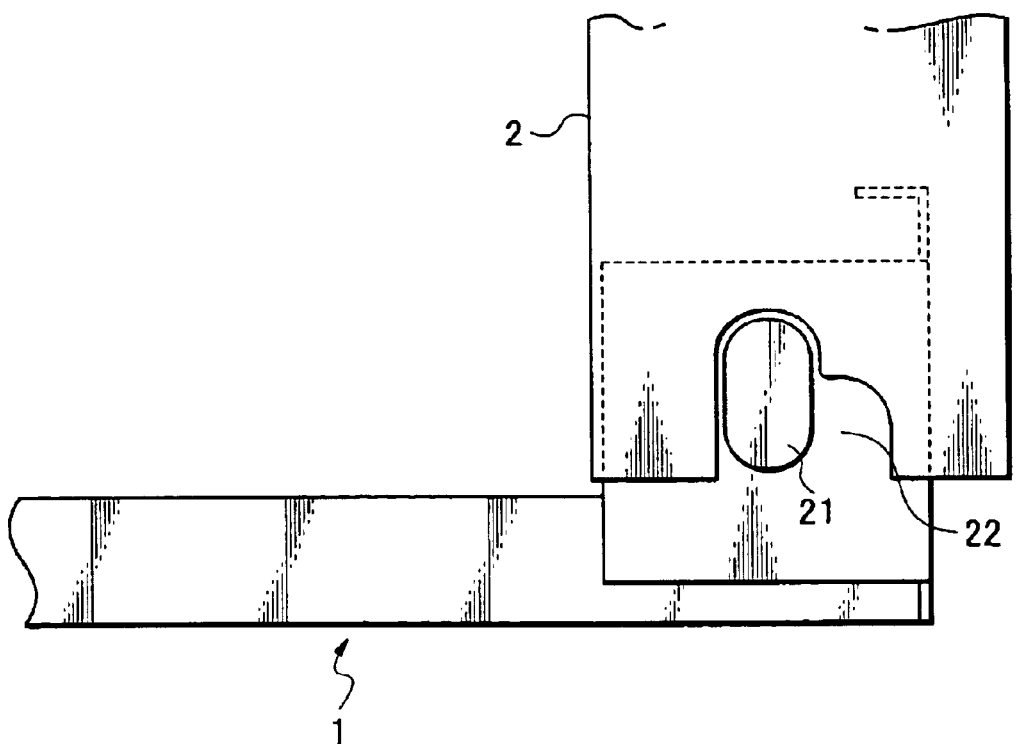
FIG. 7(b) is a main portion side view showing the sate where the cover shown in FIG. 7(a) is upright.

FIG. 7(a) shows the state where the cover 2 is closed and covers the case main body 1 and FIG. 7(b) shows the state where the cover 2 is opened and upright relative to the case main body 1. Under the horizontal and vertical states of the cover 2, the projection 21 having the elongated circular shape fits to the groove 22. Each groove 22 has a shape combination of an elongated circular shape into which the elongated circular projection 21 is fitted when the cover 2 is closed and an elongated circular shape into which the same elongated circular projection 21 fits when the cover 2 is upright. Therefore, the cover 2 can stand upright without turning down.

Figure 8:
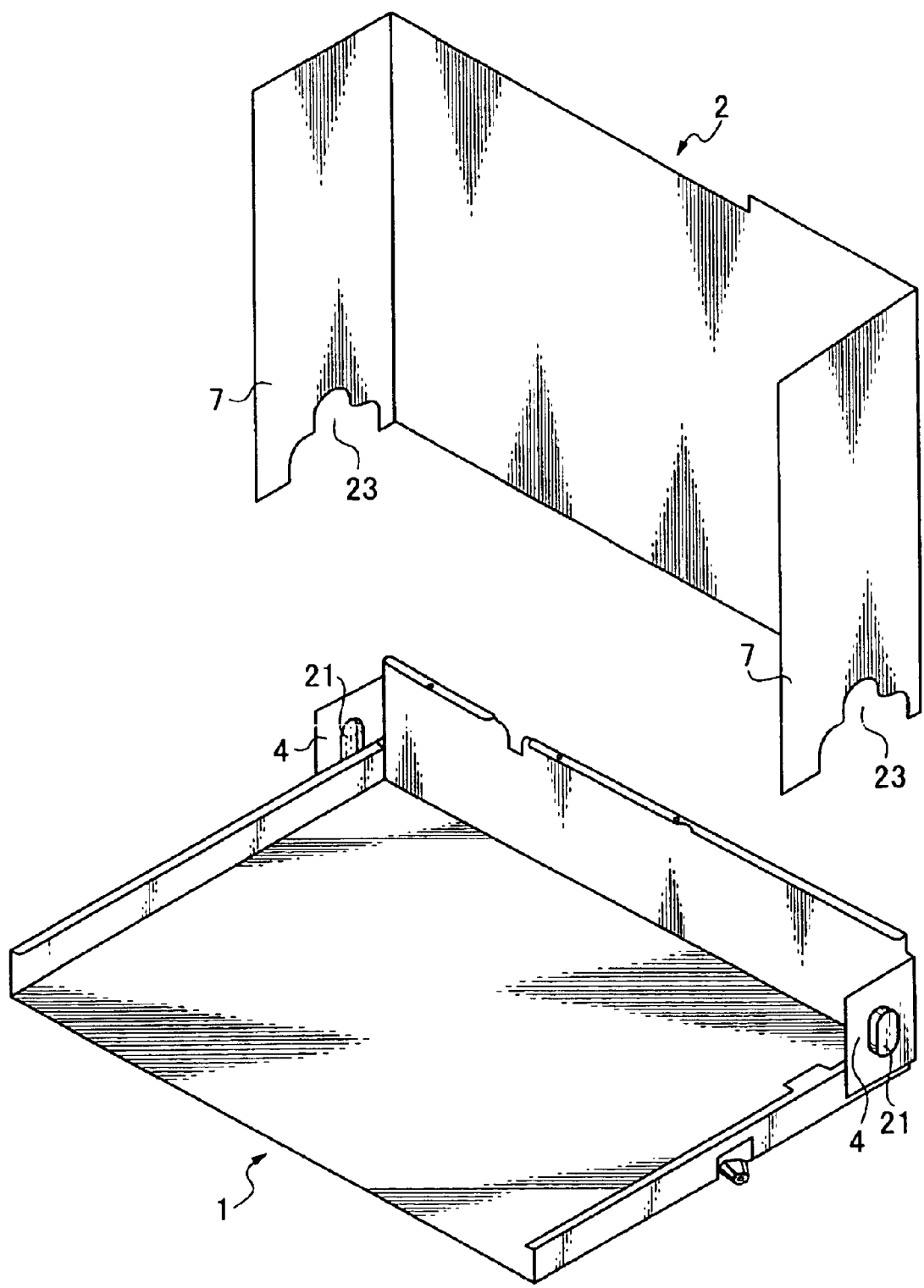
FIG. 8 is a perspective view showing another embodiment of the invention.
Figure 9:
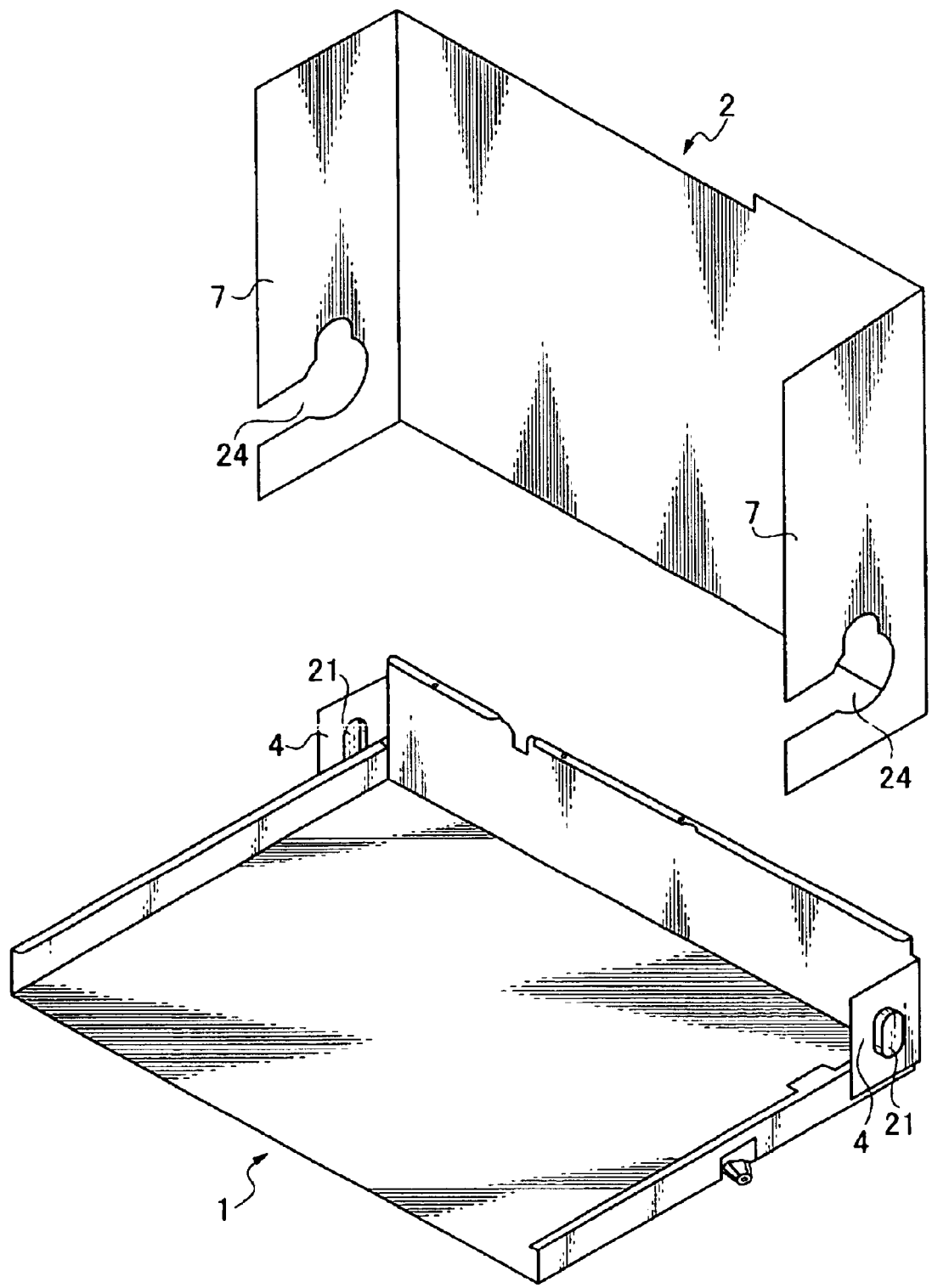
FIG. 9 is a perspective view showing still another embodiment of the invention.

The shape of the grooves in the fourth embodiment may be any shape so long as the elongated circular projections 21 can fit under the horizontal and vertical condition. For example, the groove may be a groove 23 having an elongated circular shape at the center in the vertical direction as shown in FIG. 8 or a groove 24 that is formed by cutting from below the side plate and has a shape combination of a circle the diameter of which corresponds the major diameter of an elongated circular shape and an elongated circular shape to which the projection 21 fits in the vertical direction so that the cover 2 can turn around the elongated circular projections 21 when it is opened. In either case, when the cover 2 is put on the case main body 1, the elongated circular projections 21 fit and when the cover 2 is opened and turned upright, the elongated circular projections 21 also fit. The cover 2 stands upright without turning down under the open state.

In the embodiment, the elongated circular projections and the grooves comprising the combination of the elliptic shapes are explained by way of example, but the cover can stand upright without rotating while fined to the grooves when the projections have the shapes other than the circle.

What is claimed is:

1. A cover support structure of a shield case including a case main body having a bottom plate, two side plates and a back plate and a cover having an upper plate and two side plates for covering said case main body, wherein one of said side plates of said cover has a first slit groove formed therein so as to open rearwardly and said upper plate has a cut therein at a side thereof of the other of said two side plates of said cover so as to form a support plate extending downwardly, said support plate having a second slit groove formed therein so as to open rearwardly, said first slit groove being formed by cutting the one of said side plates of said cover from a rear end of the one of said side plates of said cover, said second slit groove being formed by cutting said support plate, and said first slit groove and said second slit groove are arranged to be positionable to mesh with said back plate of said case main body in an open position of said cover to support and maintain said cover in an upright position so that said cover is prevented from turning downward in the open position thereof.

2. The cover support structure of claim 1, wherein said back plate of said case main body has a third slit groove formed therein so as to open upwardly, said third slit being formed by cutting said back plate so that said third slit groove is opposed to one of said first slit groove and said second slit groove so that said third slit groove meshes with the one of said first slit groove and said second slit groove in the open position of said cover.

3. A cover support structure of a shield case including a case main body having a bottom plate, two side plates and a back plate and a cover having an upper plate and two side plates for covering said case main body, wherein each of said side plates of said case main body has an engagement groove formed in a protrusion protruding outward of said side plates of said main case body, each said engagement groove opening upward, and each of said side plates of said cover has a cylindrical projection protruding outward therefrom and fitted in a respective said engagement groove of said case main body so that said cover can turn to open and close with said circular cylindrical projection as a pivot axis, and wherein said cover can be supported in an upright position with a rear edge of said upper plate of said cover maintaining contact with said back plate of said case main body when said cover is opened.

4. A cover support structure of a shield case including a case main body having a bottom plate, two side plates and a back plate and a cover having an upper plate and two side plates for covering said case main body, wherein each of said side plates of said case main body has an elongated circular projection formed therein, and each of said side plates of said cover has an engagement groove formed therein so as to open rearward or downward, each said engagement groove having a respective said elongated circular projection fitted therein, and each said engagement groove having a shape such that said cover can be opened to stand in a vertical condition and closed to lie in a horizontal condition and such that said cover is maintained upright by engagement between each said engagement groove and a respective said elongated circular projection in the vertical condition of said cover.

* * * * *